United States Patent
Karpov et al.

(10) Patent No.: US 10,825,861 B2
(45) Date of Patent: Nov. 3, 2020

(54) MULTILAYER SELECTOR DEVICE WITH LOW LEAKAGE CURRENT

(71) Applicant: Intel Corporation, Santa Clara, CA (US)

(72) Inventors: Elijah V. Karpov, Portland, OR (US); Prashant Majhi, San Jose, CA (US); Ravi Pillarisetty, Portland, OR (US); Uday Shah, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/077,603

(22) PCT Filed: Mar. 31, 2016

(86) PCT No.: PCT/US2016/025433
§ 371 (c)(1),
(2) Date: Aug. 13, 2018

(87) PCT Pub. No.: WO2017/171820
PCT Pub. Date: Oct. 5, 2017

(65) Prior Publication Data
US 2019/0058006 A1     Feb. 21, 2019

(51) Int. Cl.
*H01L 27/24*     (2006.01)
*H01L 45/00*     (2006.01)
*G11C 13/00*     (2006.01)

(52) U.S. Cl.
CPC ........ *H01L 27/2427* (2013.01); *G11C 13/003* (2013.01); *G11C 13/0004* (2013.01);
(Continued)

(58) Field of Classification Search
CPC . H01L 27/2427; H01L 27/2463; H01L 45/04; H01L 45/06; H01L 45/1206;
(Continued)

(56) References Cited

U.S. PATENT DOCUMENTS 9,246,087 B1 *  1/2016  Wang ..................... H01L 45/12
9,595,670 B1 *  3/2017  Gee ....................... H01L 45/085
(Continued)

FOREIGN PATENT DOCUMENTS

WO       2017111894 A1    6/2017

OTHER PUBLICATIONS

The International Searching Authority, Written Opinion of the International Searching Authority and the International Search Report dated Dec. 16, 2016 in International Application No. PCT/US2016/025433, 12 pages.
(Continued)

*Primary Examiner* — Frenando L Toledo
*Assistant Examiner* — Neil R Prasad
(74) *Attorney, Agent, or Firm* — Trop, Pruner & Hu, P.C.

(57) ABSTRACT

An embodiment includes an apparatus comprising: first and second electrodes; first and second insulation layers between the first and second electrodes; and a middle layer between the first and second insulation layers; wherein (a) the middle layer includes material that has a first resistance when the first electrode is biased at a first voltage level and a second resistance when the first electrode is biased at a second voltage level; (b) the first resistance is less than the second resistance and the first voltage level is greater than the second voltage level. Other embodiments are described herein.

13 Claims, 7 Drawing Sheets

(52) U.S. Cl.
CPC ...... *G11C 13/0007* (2013.01); *H01L 27/2463* (2013.01); *H01L 45/04* (2013.01); *H01L 45/06* (2013.01); *H01L 45/1206* (2013.01); *H01L 45/1233* (2013.01); *H01L 45/1253* (2013.01); *H01L 45/142* (2013.01); *H01L 45/143* (2013.01); *H01L 45/144* (2013.01); *H01L 45/146* (2013.01); *H01L 45/147* (2013.01); *G11C 2213/51* (2013.01); *G11C 2213/52* (2013.01); *G11C 2213/53* (2013.01); *G11C 2213/54* (2013.01); *G11C 2213/76* (2013.01); *G11C 2213/79* (2013.01); *H01L 45/1608* (2013.01)

(58) Field of Classification Search
CPC ............ H01L 45/1233; H01L 45/1253; H01L 145/142; H01L 45/143; H01L 45/144; H01L 45/146; H01L 45/147; H01L 45/1608; G11C 13/0004; G11C 13/0007; G11C 13/003; G11C 2213/51; G11C 2213/52; G11C 2213/53; G11C 2213/54; G11C 2213/76; G11C 2213/79

See application file for complete search history.

(56) References Cited

U.S. PATENT DOCUMENTS

| | | |
|---|---|---|
| 2011/0310655 A1* | 12/2011 | Kreupl ................ H01L 365/148 |
| 2012/0250395 A1 | 10/2012 | Nodin |
| 2013/0134382 A1 | 5/2013 | Martens et al. |
| 2013/0264534 A1 | 10/2013 | Hwang et al. |
| 2014/0209892 A1 | 7/2014 | Kuo et al. |
| 2014/0264252 A1 | 9/2014 | Hashim et al. |
| 2015/0123066 A1 | 5/2015 | Gealy et al. |
| 2015/0263069 A1 | 9/2015 | Jo |
| 2017/0338279 A1* | 11/2017 | Yang .................... H01L 27/224 |

OTHER PUBLICATIONS

U.S. Appl. No. 15/755,566, filed Feb. 27, 2018, entitled "Self-Aligned Memory Array" by Elijah V. Karpov, et al.

* cited by examiner

US 10,825,861 B2

MULTILAYER SELECTOR DEVICE WITH LOW LEAKAGE CURRENT

TECHNICAL FIELD

Embodiments of the invention are in the field of semiconductor devices and systems.

BACKGROUND

Selection/selector devices are found in many different forms. For example, selector devices may replace transistors in non-volatile memory arrays. Selector devices may also be used in phase change memory (PCM) arrays. Such devices may use various materials, such as chalcogenide glass, that exhibit volatile transition from a non-conductive state to a conductive state based on how the devices are biased. Selector devices, however, often have unacceptable leakage current which leads to power inefficiency and overall poor product performance.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Embodiments include an embedded non-volatile memory (eNVM) multilayer selector device with a relatively low leakage current ($I_{off}$). Such selector switches or devices may be included in transistorless memory arrays. Such selector switches may be more generally included in systems with field effect transistors that rely on selectors with low leakage current to form a three terminal device called a HP-FET.

Figure 1:
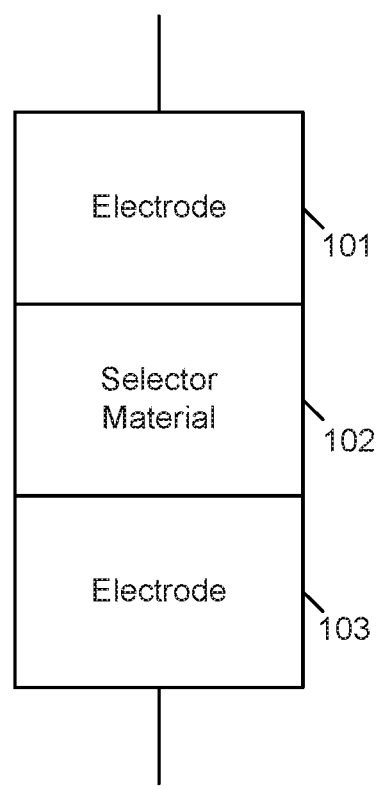
FIG. 1 includes a conventional switching device.

Such embodiments provide an improvement over conventional selector switches such as chalcogenide glass-based threshold switches that are directly sandwiched between two electrodes. For example, FIG. 1 discloses selector material 102 between electrodes 101, 103. Device 100 exhibits poor leakage current and has a low $I_{on}/I_{off}$ ratio at V/2 (which is ½ of the threshold voltage needed to transition the selector material to its conducting state).

Figure 2:
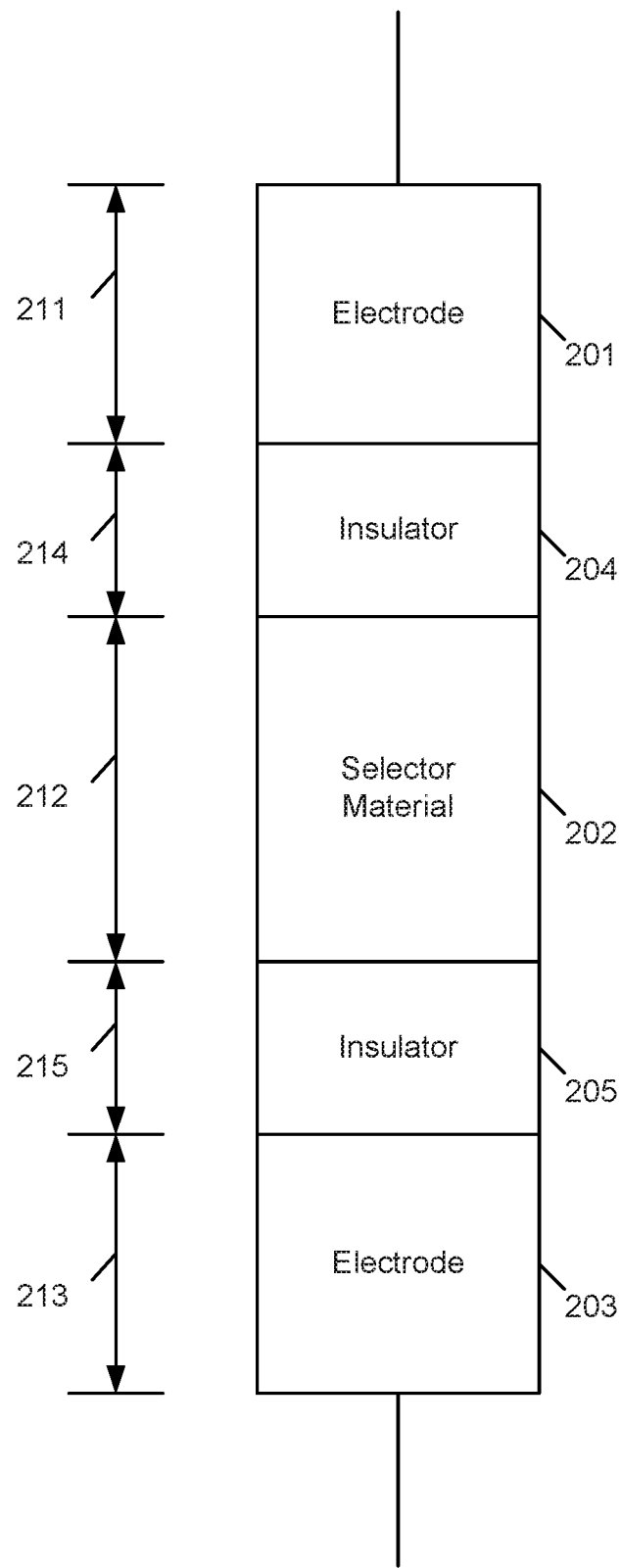
FIG. 2 includes a switching device in an embodiment.

In contrast, FIG. 2 includes an embodiment that uses three functional layers for the selector stack. The selector material 202 is located between two insulative layers 204, 205, which are in turn between electrodes 201, 203. Device 200 has a high $I_{on}/I_{off}$ ratio at V/2 (where $I_{on}$ is, e.g., 1000× that of $I_{off}$), which is indicative of low leakage current. Such a high $I_{on}/I_{off}$ ratio at V/2 (e.g., 1000× for an embodiment versus 100× for conventional systems) results in improved device performance.

In some embodiments, switching layer 202 comprises multicomponent ternary or quarternary alloys. In some embodiments, the multicomponent ternary or quarternary alloys include: Se, S, Te, and/or O. In some embodiments, the first and second electrodes layers 201 and 203, respectively, are formed of one of: metals (e.g., copper, tungsten, tantalum, titanium, hafnium, zirconium, aluminum, silver, tin, lead); metal alloys (which are alloys of the metals listed immediately above); metal nitrides (e.g., titanium nitride, tantalum nitride); metal carbides (e.g., hafnium carbide, zirconium carbide, titanium carbide, tantalum carbide, aluminum carbide, other conductive materials), or any combination thereof.

In some embodiments, switching layer 202 comprises a chalcogenide material. In some embodiments, the chalcogenide material is one of: alloys of (a) Si sulfide, selenide or telluride, with (b) Ge sulfide, selenide or telluride (where the fraction of Si and Ge can each vary from 0% to 100%). In some embodiments, As or Bi are part of a Si/Ge based chalcogenides alloy discussed above. In some embodiments, transition metals such as Cu, Ga, In, Ag, and V can be used with Ge—Se/Se/Te or Si—Se/Te/S based chalcogenides.

In some embodiments, switching layer 202 comprises a multilayer device including one of a metal-insulator-transition (MIT) material or Mott transition material. In some embodiments, the MIT or Mott materials are formed of at least one of: Mott Oxides such as $NbO_2$, metal doped $NbO_2$, $VO_2$, metal-doped $V_2O_3$, $Fe_3O_4$, FeS, $Ta_2O_5$, $Ti_3O_5$, $Ti_2O_3$, $LaCoO_3$, and/or $SmNiO_3$. In some embodiments other MIT materials that undergo a volatile metal insulator transition can be used.

In some embodiments insulative layers 204, 205 include layers deposited using atomic layer deposition (ALD) to form thin, uniform insulating layers, but other embodiments are not so limited. The layers may include stoichiometric oxides (e.g., $Al_2O_3$, $HfO_2$, $Nb_2O_5$) as well as substoichiometric oxides (e.g., NbOx, TiOx, HfOx, AlOx).

In an embodiment the insulative layers 204, 205 are relatively thin and are thinner than any of layers 201, 202, 203. Heights 214, 215 may be equal to one another but that is not necessarily the case in all embodiments. Height 214 may be 2 nm but in other embodiments is 1, 3, 4, 5 nm or more. Height 215 may be 2 nm but in other embodiments is 1, 3, 4, 5 nm or more. The relative thinness of heights 214, 215 can be critical in embodiments because insulative layers 204, 205 that are too thin will fail to arrest or deter leakage current but layers that are too thick will hinder the ability to drive the selector material past its voltage threshold to transition to an on/conductive state. In contrast, layers 211, 212, 213 may each be 5 nm thick or more.

Transistors in various circuits and logic blocks described herein are metal oxide semiconductor (MOS) transistors or their derivatives, where the MOS transistors include diffusion regions such as drain and source regions, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes, spintronic, planar (e.g., planar MOS) devices. Those skilled in the art will appreciate that other transistors, for example, Bi-polar junction transistors (BJT PNP/NPN), BiCMOS, CMOS, etc., may be used without departing from the scope of the disclosure. Here, a p-type transistor is labeled as "MP" and an n-type transistor is labeled as "MN."

Figure 3:
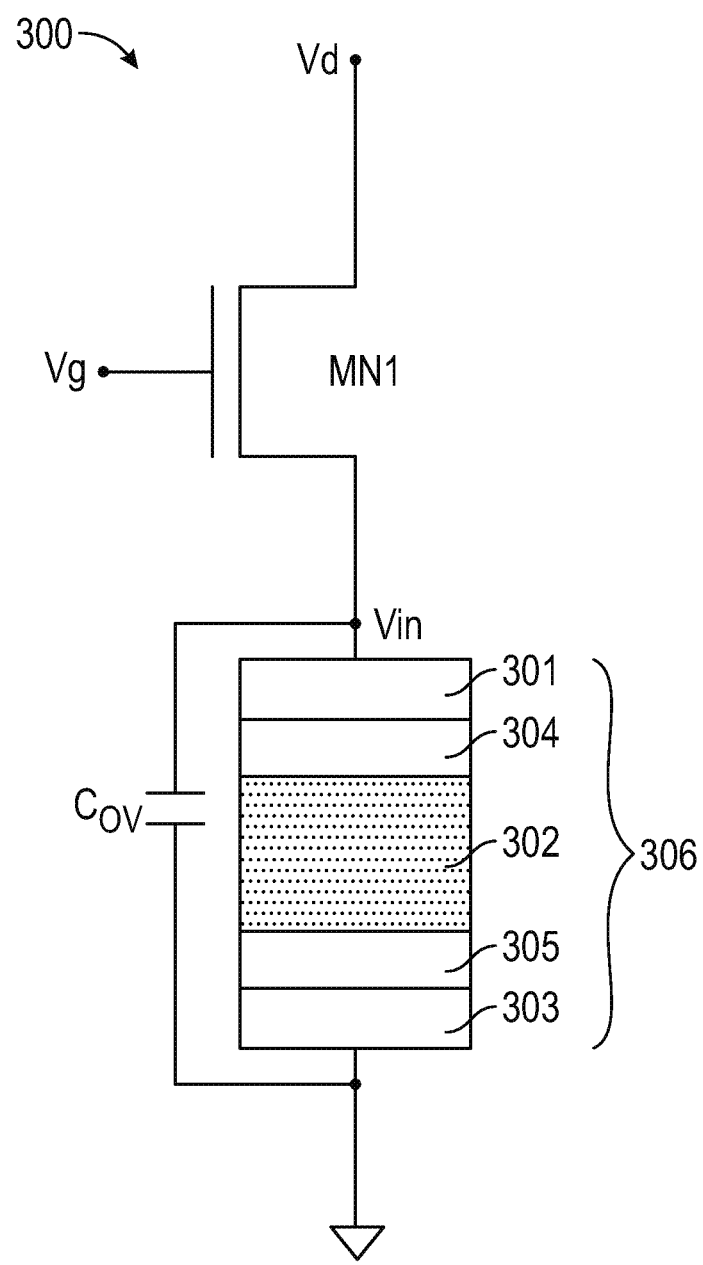
FIG. 3 includes a hybrid phase field effect transistor (HP-FET) in an embodiment.

FIG. 3 illustrates a HP-FET having a multi-layer threshold switch. The n-type HP-FET 300 comprises an n-type transistor MN1 and a multi-layer threshold switch 306 coupled in series with the transistor MN1.

In some embodiments, multi-layer threshold switch 306 is a two terminal device. In some embodiments, the first terminal of multi-layer threshold switch 306 is coupled to a source terminal $V_{in}$ of transistor MN1 while the second terminal of multi-layer threshold switch 306 is coupled to ground or to a load device. As such, n-type HP-FET 300 forms a four terminal device with a gate terminal coupled to $V_g$, drain terminal coupled to $V_d$, source terminal coupled to a terminal of multi-layer threshold switch 306, and a bulk or substrate terminal of transistor MN1. Here, $C_{OV}$ is the overlap capacitance due to the source region of transistor MN1 and due to multi-layer threshold switch 306. In some embodiments, the drain terminal $V_d$ of transistor MN1 is coupled to another circuit or supply node $V_{dd}$. Here, labels for signals and nodes are interchangeably used. For example, the term "Vg" may refer to voltage Vg or node Vg depending on the context of the sentence.

In some embodiments, multi-layer threshold switch 306 has a variable resistance with a high resistance bound above which the transistor MN1 does not turn on. In some embodiments, the high resistance bound of multi-layer threshold switch 306 is given by the resistance of transistor MN1 in the OFF state (i.e., $R_{OFF}$) divided by the factor of $(V_d/V_{th-1})$ where "$V_d$" is applied source drain bias across these two devices (i.e., transistor MN1 and multi-layer threshold switch 306) in series, and where "$V_{th}$" is a threshold voltage of multi-layer threshold switch 306.

In some embodiments, multi-layer threshold switch 306 has a low resistance bound below which the transistor MN1 does not turn off. In some embodiments, the low resistance bound is given by the resistance "$R_{on}$" of transistor MN1 in the ON state divided by the factor of $(V_d/V_h)$, where "$V_h$" is a holding voltage of multi-layer threshold switch 306 below which multi-layer threshold switch 306 becomes resistive. As such, in some embodiments, the OFF current of HP-FET 300 is set by the high resistance bound of multi-layer threshold 306 while the ON current of HP-FET 300 is set by the maximum current that the transistor MN1 can drive.

Other embodiments include a p-type HP-FET whereby instead of using an n-type transistor a p-type transistor MP1 is used.

FIG. 3 illustrates n-type HP-FET 300 showing the cross-section of multi-layer threshold switch 301, in accordance with some embodiments. In some embodiments, cross-section of multi-threshold device 306 includes a first electrode 301, an insulative layer 304, a switching layer 302, an insulative layer 305, and a second electrode 303. In some embodiments, first electrode 301 is coupled to the source terminal of transistor MN1. In some embodiments, first insulative layer 304 is coupled to first electrode 301 and switching layer 302. In some embodiments, second insulative layer 305 is coupled to switching layer 302 and second electrode 303. In some embodiments, the second electrode 303 provides the source terminal of HP-FET 300.

Materials for the layers of device 306 are as described above with regard to FIG. 2.

In some embodiments, multi-layer threshold switch 306 has two states—metallic state (or conductive state) and insulating state. In some embodiments, the two states are switched according a bias voltage applied across the two terminals of multi-layer threshold switch 306. In some embodiments, for the case where the initial or current condition of multi-layer threshold switch 306 is an insulating state, as voltage across multi-layer threshold switch 306 rises to threshold voltage $V_t$ (e.g., 0.5V), multi-layer threshold switch 306 switches from an insulating state to a conducting state. At that state, the minimal current is higher than $I_h$, which is substantially non-zero. This is the ON state where current is limited by the transistor in series.

In some embodiments, when the initial or current condition of multi-layer threshold switch 306 is a conducting state, as voltage across multi-layer threshold switch 306 reduces and reaches a holding voltage $V_h$ (e.g., 0.3V), multi-layer threshold switch 306 switches from a conducting state to an insulating state. At that state, the current is less than $I_t$, which is substantially zero. The slope of a related IV curve above $V_t$ is the resistance of multi-layer threshold switch 306 in the conductive state (i.e., $R_{metallic}$), while the slope of the IV curve below $V_t$ is the resistance of multi-layer threshold switch 306 in the insulating state (i.e., $R_{insulating}$). In some embodiments, the threshold and holding voltages $V_t$ and $V_h$, respectively, are selected such that the OFF current of HP-FET 300 is set by the high resistance bound of multi-layer threshold switch 306 while the ON current of HP-FET 300 is set by the maximum current that the transistor MN1 can drive.

Switch 306 may directly contact a node or pad or contact of MN1 or may be located several metal layers above transistor MN1 and may only contact transistor MN1 indirectly through vias.

Figure 4:
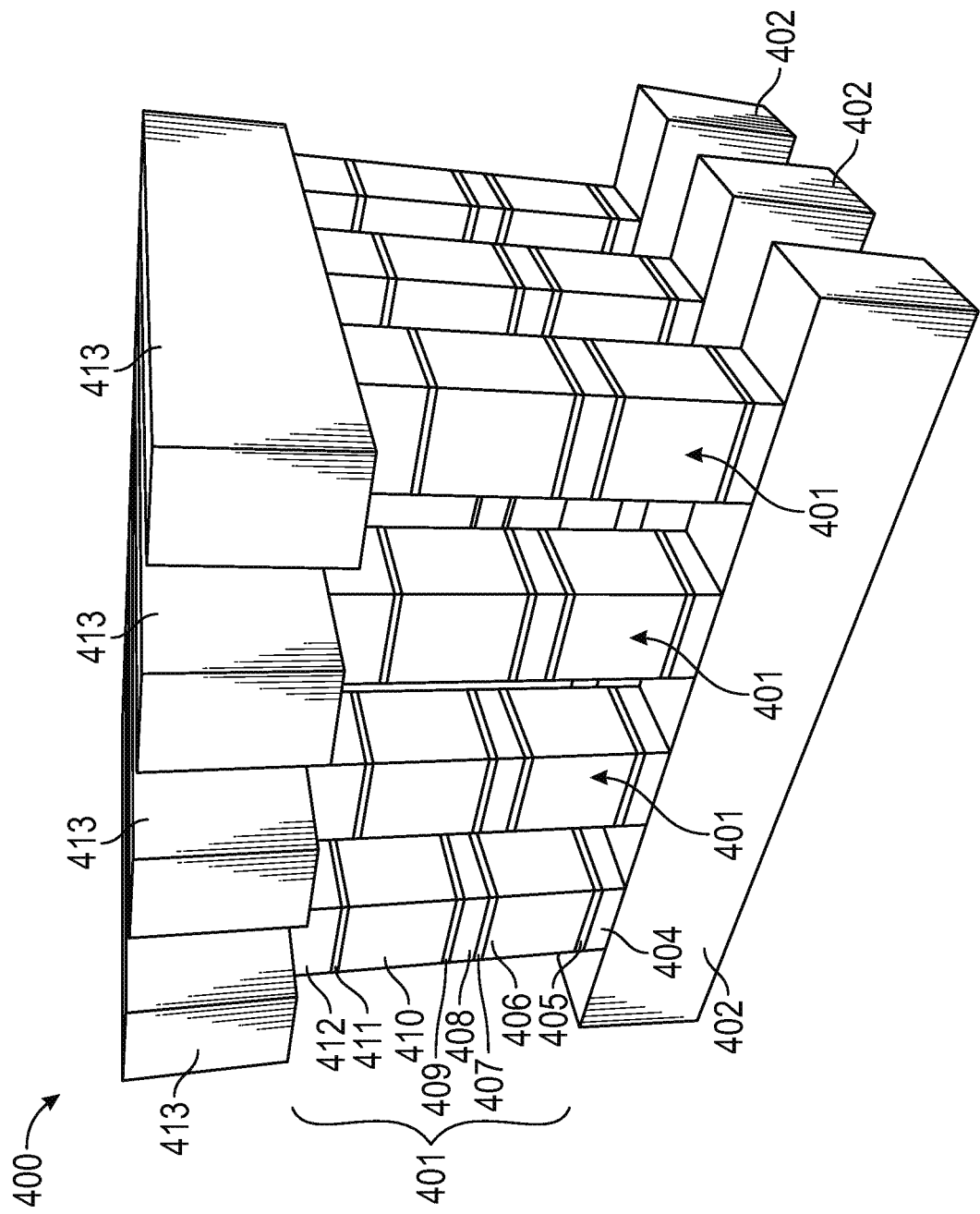
FIG. 4 includes a transistorless non-volatile memory in an embodiment.

FIG. 4 includes a transistorless non-volatile memory array 400. More specifically, FIG. 4 depicts a perspective view of one exemplary embodiment of a portion of a chalcogenide-based phase-change cross point memory array 400. Cross-point memory 400 can be, but is not limited to, part of a solid-state memory array or a solid-state drive. Cross point memory 400 comprises a plurality of memory cells 401 that are each arranged in a column (or pillar), of which only a few are indicated. Additionally, it should be understood that a dielectric material that is normally between memory cells 401 is not shown in FIG. 4 for clarity.

Each memory cell 401 comprises an electrode 404 (e.g., Pd) formed on a word line metallization 402. An ALD deposited thin insulator (e.g., $Al_2O_3$, $Nb_2O_5$, and the like) 405 is formed on electrode 404. A switching device (SD) switching layer 406 (e.g., $VO_2$, $Ti_2O_3$, $NbO_2$, $SmNiO_3$) is formed on insulator layer 404. Another ALD deposited thin insulator layer 407 is formed on layer 406. An electrode 408 (e.g., Pd) is formed on insulator layer 407.

An embodiment forms an electrode-chalcogenide interface layer 409 on electrode 408. Layer 409 may include tungsten and/or molybdenum carbide and/or boride interface layers. The interface layer formed between an electrode layer 408 and chalcogenide layer 410 provides a reduced resistance in comparison to an electrode-chalcogenide interface without a carbide- and/or boride-based interface layer. Interface layers such as layers 409, 411 are described more fully in U.S. Patent Application Publication Number 20150123066, assigned to Intel Corp. of Santa Clara, Calif., USA and are included in some but not all memory related embodiments described herein. A chalcogenide memory cell (MC) 410 is formed on interface layer 409. An electrode-chalcogenide interface layer 411 is formed on MC 410. An electrode 412 is formed on interface layer 411. A bit line metallization layer 413 is formed on electrode 412.

The memory cell (layers 409, 410, 411, 412) is not limited to PCM. Other memory element options are, for example, programmable metallization cell (PMC) memory cells (also sometimes referred to as conductive bridge random access memory (CBRAM)) based on Ag or Cu filaments. Other memory element options are, for example, HfOx or TaOx based resistive RAM (RRAM) based on oxygen vacancy based filaments, or other resistive switching memories.

In embodiments of the subject matter disclosed herein, word line metallization layer 402 and bit line metallization layer 413 are formed from, for example, tungsten, copper and/or aluminum. In one exemplary embodiment, electrode layers 404, 408 and 412 are composite electrodes that are formed from, for example, carbon (C) and/or titanium nitride (TiN). In one exemplary embodiment, switching device layer 406 is formed from, for example, an OTS (Ovonic Threshold Switch) comprising a glassy mixture of the chalcogenides, such as, but not limited to, Te and Se, and glass forming additives such as, but not limited to, arsenic (As), germanium (Ge) and silicon (Si). Note that this is not an exhaustive list of either chalcogenides or glass forming additives. In other embodiments, layer 406 may include MIT or Mott materials formed of one of: Mott Oxides such as $NbO_2$, metal doped $NbO_2$, $VO_2$, metal-doped $V_2O_3$, $Fe_3O_4$, FeS, $Ta_2O_5$, $Ti_3O_5$, $Ti_2O_3$, $LaCoO_3$, or $SmNiO_3$. In one exemplary embodiment, chalcogenide memory cell 410 is formed from, for example, but is not limited to, $Ge_2Sb_2Te_5$ (GST) and $In_3SbTe_2$ (IST).

In one exemplary embodiment, electrode-chalcogenide interface layers 409 and 411 are formed from carbides and/or borides of tungsten (W) and/or molybdenum (Mo). In one exemplary embodiment, interface layers 409 and 411 are formed by using, for example, a reactive physical vapor deposition (PVD) (e.g., reactive sputtering) from W/Mo targets using unsaturated organic carbon compounds, such as benzene and acetylene. In another exemplary embodiment, interface layers 409 and 411 are formed non-reactively by being sputtered from W/Mo carbide and boride targets. Although interface layers 409 and 411 are depicted in FIG. 4, it should be understood that alternative exemplary embodiments may have fewer (e.g., 0 or 1) or more interface layers (e.g., 2 or more).

FIG. 4 depicts a schematic diagram of an exemplary embodiment of a cross-point memory array 400 comprising a plurality of memory cells 401. Memory cells 401 are located at intersections of column signal lines 402 (e.g., word lines) and row signal lines 413 (e.g., bit lines). Individual column and/or row signal lines are electrically connected in a well-known manner to a memory controller (not shown) to selectively operate memory cells 401 in a well-known manner. It should be understood that memory array 400 can comprise part of a solid-state memory array or a solid-state drive that is coupled in a well-known manner to a computer system or an information-processing system (not shown).

Figure 5:
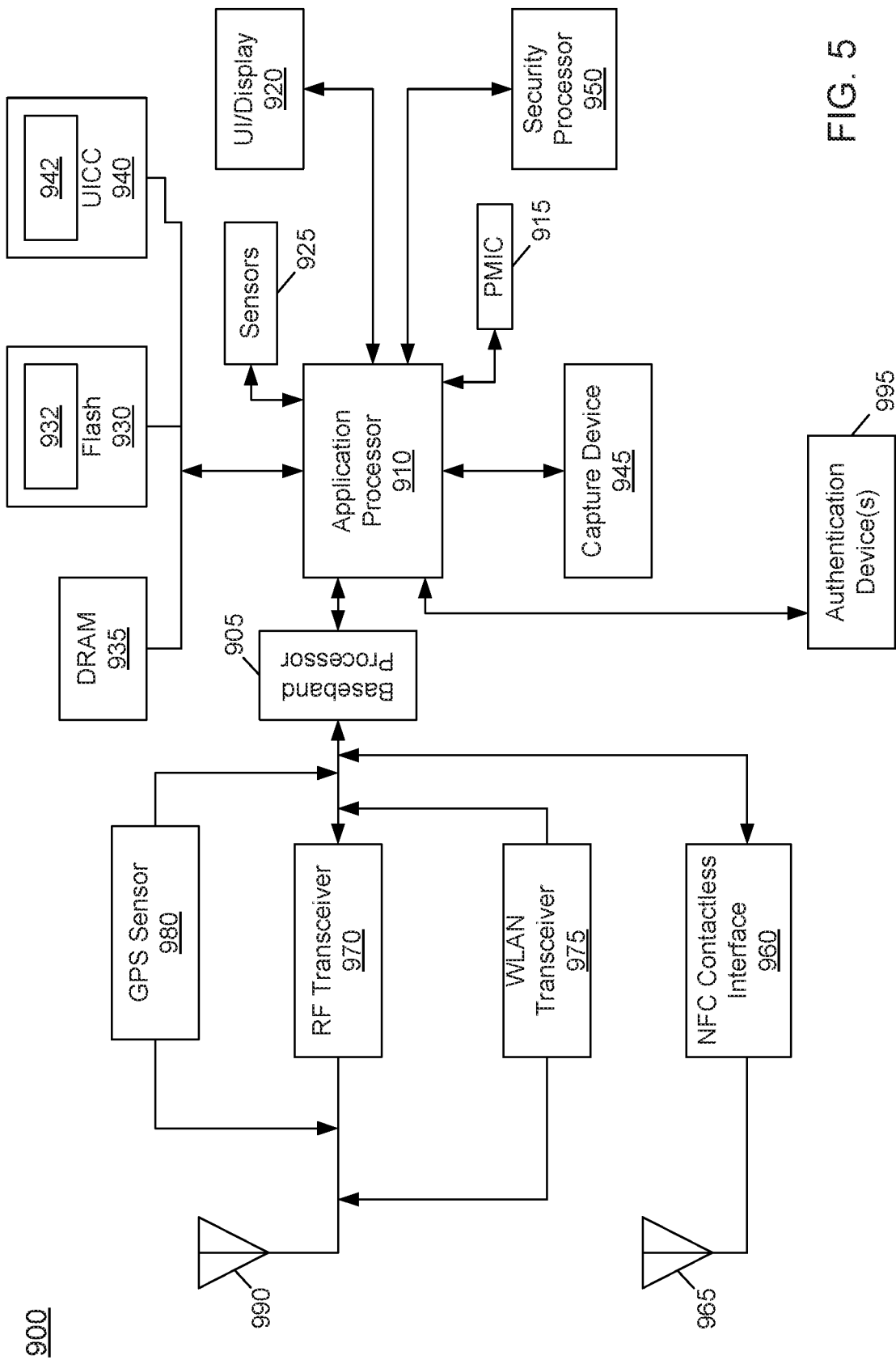
FIGS. 5, 6, 7 include systems that include embodiments.
Figure 6:
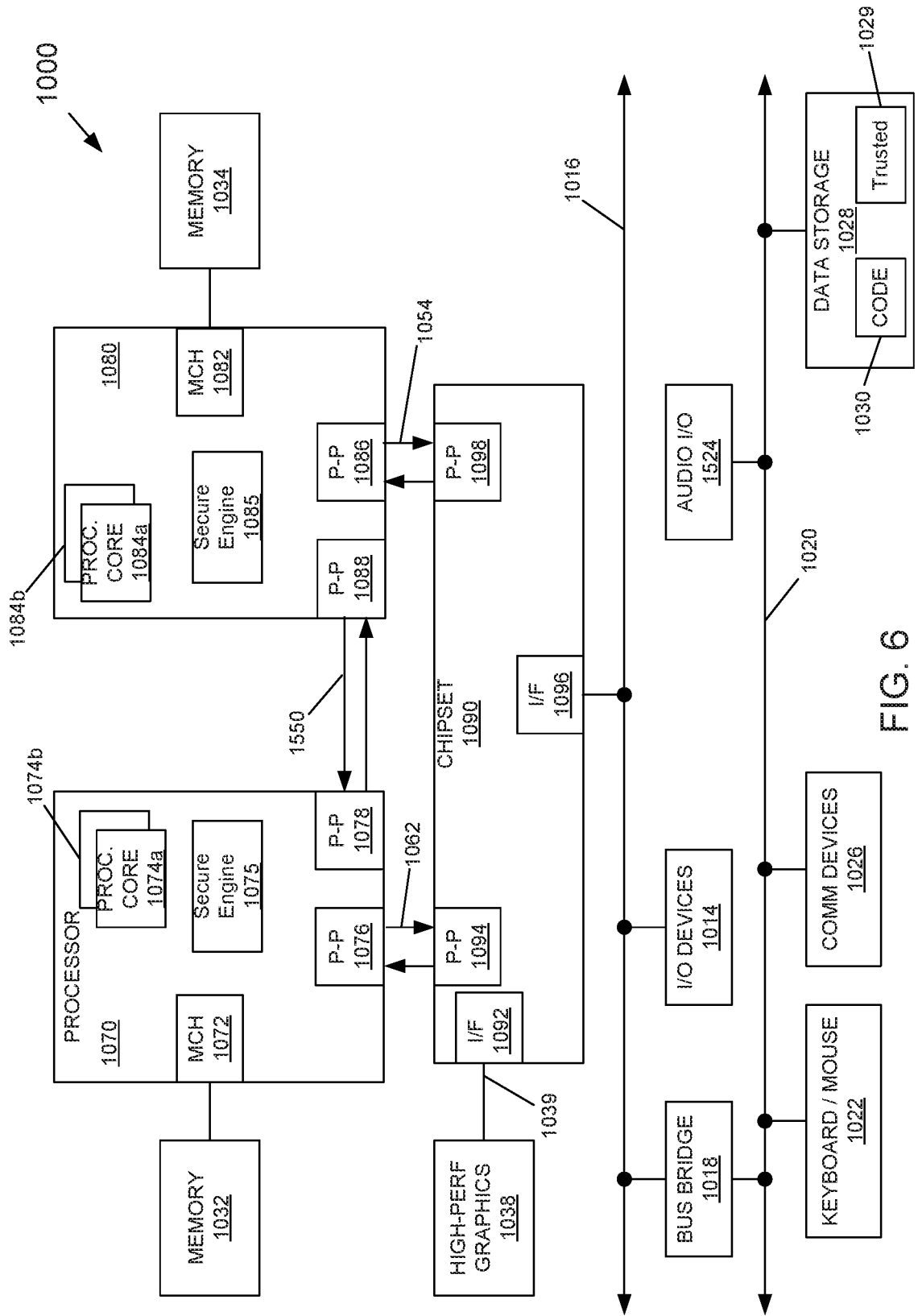
Figure 7:
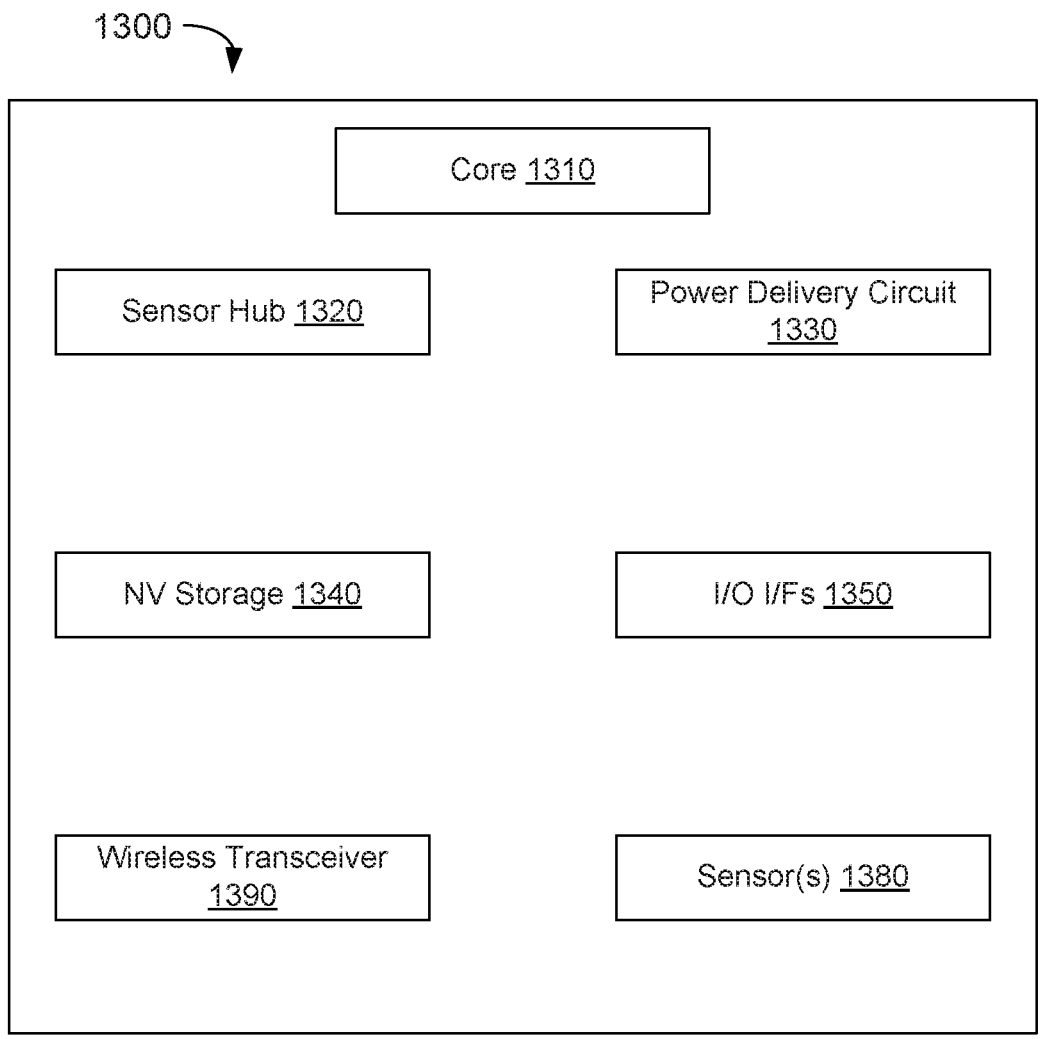

FIGS. 5, 6, 7 each include a system that may include any of the above described embodiments. FIGS. 5, 6, and 7 include block diagrams of systems 900, 1000, 1300 in accordance with embodiments. Each of those systems may include hundreds or thousands of the above described selector switches (e.g., FIG. 2) and be critical to functions (e.g., memory functions of memories that include such selector switches) in those systems. The selector switches may be included in, for example, elements 910, 930, 1070, 1032, 1090, 1310, 1340, 1380, and the like. Systems 900, 1000, 1300 may be included in, for example, a mobile computing node such as a cellular phone, smartphone, tablet, Ultrabook®, notebook, laptop, personal digital assistant, and mobile processor based platform. The size savings and power efficiency of such devices accumulates when, for example, the selector switch based memories are deployed in mass and provides significant performance advantages to such computing nodes.

Referring now to FIG. 5, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920, e.g., a touch screen display. In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, e.g., user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals, e.g., AM/FM and other signals may also be provided. In addition, via WLAN transceiver 975, local wireless communications, such as according to a Bluetooth™ or IEEE 802.11 standard can also be realized.

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as key management, attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. First processor 1070 and second processor 1080 may be coupled to a chipset 1090 via P-P interconnects 1052 and 1054, respectively. As shown in FIG. 6, chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Embodiments may be used in environments where Internet of Things (IoT) devices may include wearable devices or other small form factor IoT devices. Referring now to FIG. 7, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes an apparatus comprising: first and second electrodes; first and second insulation layers between the first and second electrodes; and a middle layer between the first and second insulation layers; wherein (a) the middle layer includes material that has a first resistance when the first electrode is biased at a first voltage level and a second resistance when the first electrode is biased at a second voltage level; (b) the first resistance is less than the second resistance and the first voltage level is greater than the second voltage level.

In example 2 the subject matter of the Example 1 can optionally include wherein each of the first and second insulation layers includes at least one member selected from the group comprising: $Al_2O_3$, $HfO_2$, $TiO_2$, $ZrO_2$, $Ta_2O_5$, and $Nb_2O_5$.

In example 3 the subject matter of the Examples 1-2 can optionally include wherein the material of the middle layer includes at least one member selected from the group comprising: a chalcogenide material, a metal-insulator-transition (MIT) material, and a Mott transition material.

In example 4 the subject matter of the Examples 1-3 can optionally include a transistor having a gate electrode, a source region, and a drain region; and one of the first and second electrodes is coupled to one of the source and drain regions.

In example 5 the subject matter of the Examples 1-4 can optionally include a hybrid phase field effect transistor (HP-FET) comprising the transistor and a selector switch that includes: the first and second electrodes, the first and second insulation layers, and the middle layer.

In example 6 the subject matter of the Examples 1-5 can optionally include wherein the selector switch has a variable resistance with a high resistance threshold above which the transistor does not turn on, and a low resistance threshold below which the transistor does not turn off.

In example 7 the subject matter of the Examples 1-6 can optionally include a selector switch that includes the first and second electrodes; the first and second insulation layers, and the middle layer, wherein the selector switch is connected in series with the transistor.

In example 8 the subject matter of the Examples 1-7 can optionally include wherein another of the source and drain regions is coupled to one of a ground and a supply node.

In example 9 the subject matter of the Examples 1-8 can optionally include a phase-change memory cell that includes a chalcogenide-based phase-change memory layer and a selector switch that includes the first and second electrodes; the first and second insulation layers, and the middle layer.

In example 10 the subject matter of the Examples 1-9 can optionally include a third electrode, wherein the chalcogenide-based phase-change memory layer is between the third electrode and one of the first and second electrodes.

In example 11 the subject matter of the Examples 1-10 can optionally include bit and write lines, wherein the third electrode couples directly to one of the bit and write lines and another of the one of the first and second electrodes couples directly another of the bit and write lines.

By "directly" this still allows for coupling by way of a via or trace.

In example 12 the subject matter of the Examples 1-11 can optionally include wherein the first and second electrodes respectively directly connect to the first and second insulation layers and the first and second insulation layers respectively and directly connect to the middle layer.

In example 13 the subject matter of the Examples 1-12 can optionally include wherein the material of the middle layer includes at least one member selected from the group comprising: (a) alloys of Si sulfide, Si selenide or Si telluride with Ge sulfide, Ge selenide or Ge telluride; (b) a Si chalcogenide alloy comprising As or Bi; and (c) a Ge chalcogenide alloy comprising As or Bi.

In example 14 the subject matter of the Examples 1-13 can optionally include wherein the material of the middle layer includes one or more transition metals including Cu, Ga, In, Ag, and V used with at least one member selected from the group comprising: (a) Ge—Se, GeSe, GeTe, and (b) Si—Se, SiTe, and SiS.

In example 15 the subject matter of the Examples 1-14 can optionally include wherein the material of the middle layer includes at least one member selected from the group comprising: $NbO_2$, $VO_2$, $V_2O_3$, $Fe_3O_4$, FeS, $Ta_2O_5$, $Ti_3O_5$, $Ti_2O_3$, $LaCoO_3$, and $SmNiO_3$.

In example 16 the subject matter of the Examples 1-15 can optionally include wherein the first and second electrodes each include a member selected form the group comprising: (a) metals including copper, tungsten, tantalum, titanium, hafnium, zirconium, aluminum, silver, tin, and lead; (b) metal alloys including alloys of metals including copper, tungsten, tantalum, titanium, hafnium, zirconium, aluminum, silver, tin, and lead; (c) metal nitrides including titanium nitride, tantalum nitride; and (d) metal carbides including hafnium carbide, zirconium carbide, titanium carbide, tantalum carbide, aluminum carbide, or any combination thereof.

In example 17 the subject matter of the Examples 1-16 can optionally include wherein each of the first and second insulation layers is less than 3 nm thick and the middle layer is at least 5 nm thick.

These are critical dimensions needed to balance leakage current with threshold voltages needed to change the conductive states of the selector switch.

In example 18 the subject matter of the Examples 1-17 can optionally include a system comprising: a memory; and a processor coupled to the memory, wherein at least one of the processor and the memory include an apparatus according to any one of examples 1 to 17.

Example 19 includes an apparatus comprising: first and second electrodes; first and second insulation layers between the first and second electrodes; and a middle layer between the first and second insulation layers; wherein (a) each of the first and second insulation layers includes at least one member selected from the group comprising: $Al_2O_3$, $HfO_2$, $TiO_2$, $ZrO_2$, $Ta_2O_5$, and $Nb_2O_5$, and (b) the material of the middle layer includes at least one member selected from the group comprising: a chalcogenide material, a metal-insulator-transition (MIT) material, and a Mott transition material.

In example 20 the subject matter of Example 19 can optionally include a hybrid phase field effect transistor (HP-FET) comprising a transistor and a selector switch that includes: the first and second electrodes, the first and second insulation layers, and the middle layer.

In example 21 the subject matter of the Examples 19-20 can optionally include wherein the selector switch has a variable resistance with a high resistance threshold above which the transistor does not turn on, and a low resistance threshold below which the transistor does not turn off.

In example 22 the subject matter of the Examples 19-21 can optionally include a phase-change memory cell that includes a phase-change memory layer and a selector switch that includes the first and second electrodes; the first and second insulation layers, and the middle layer.

In example 23 the subject matter of the Examples 19-21 can optionally include a memory cell and a selector switch that includes the first and second electrodes; the first and second insulation layers, and the middle layer; wherein the memory cell is selected from the group comprising a phase change memory cell, a programmable metallization cell (PMC), and a resistive random access memory (RRAM) cell.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
first and second electrodes;
first and second insulation layers between the first and second electrodes; and
a middle layer between the first and second insulation layers;
a transistor having a gate electrode, a source region, and a drain region;
a hybrid phase field effect transistor (HP-FET) comprising the transistor and a selector switch that includes: the first and second electrodes, the first and second insulation layers, and the middle layer;
wherein (a) the selector switch is connected in series with the transistor, and (b) one of the first or second electrodes is coupled to one of the source or drain regions;
wherein (a) the middle layer includes material that has a first resistance when the first electrode is biased at a first voltage level and a second resistance when the first electrode is biased at a second voltage level; and (b) the first resistance is less than the second resistance and the first voltage level is greater than the second voltage level;
wherein the first and second electrodes respectively directly connect to the first and second insulation layers and the first and second insulation layers respectively directly connect to the middle layer;
wherein the selector switch has a variable resistance with a high resistance threshold above which the transistor does not turn on, and a low resistance threshold below which the transistor does not turn off.

2. The apparatus of claim 1 wherein:
the first insulation layer includes a composition, the composition comprising at least one of: (a)(i) aluminum and oxygen, (a)(ii) hafnium and oxygen, (a)(iii) titanium and oxygen, (a)(iv) zirconium and oxygen, (a)(v) tantalum and oxygen, (a)(vi) niobium and oxygen, (a)(vii) or combinations thereof;
the second insulation layer includes an additional composition, the additional composition comprising at least one of: (b)(i) aluminum and oxygen, (b)(ii) hafnium and oxygen, (b)(iii) titanium and oxygen, (b)(iv) zirconium and oxygen, (b)(v) tantalum and oxygen, (b)(vi) niobium and oxygen, (b)(vii) or combinations thereof.

3. The apparatus of claim 2 wherein the material of the middle layer includes at least one of a chalcogenide material, a metal-insulator-transition (MIT) material, a Mott transition material, or combinations thereof.

4. The apparatus of claim 1 wherein another of the source and drain regions is coupled to one of a ground or a supply node.

5. The apparatus of claim 3 comprising a phase-change memory cell that includes a chalcogenide-based phase-change memory layer and the selector switch.

6. The apparatus of claim 5 comprising a third electrode, wherein the chalcogenide-based phase-change memory layer is between the third electrode and one of the first or second electrodes.

7. The apparatus of claim 6 comprising bit and write lines, wherein the third electrode couples directly to one of the bit or write lines and one of the first or second electrodes couples directly another of the bit or write lines.

8. The apparatus of claim 2 wherein the material of the middle layer includes at least one of first, second, or third compositions, wherein (a) the first composition includes an alloy of at least one of Si sulfide, Si selenide, Si telluride, or combinations thereof with at least one of Ge sulfide, Ge selenide, Ge telluride, or combinations thereof; (b) the second composition includes a Si chalcogenide alloy comprising at least one of As, Bi, or combinations thereof; and (c) the third composition includes a Ge chalcogenide alloy comprising at least one of As, Bi, or combinations thereof.

9. The apparatus of claim 2 wherein the material of the middle layer includes at least one of Cu, Ga, In, Ag, V, or combinations thereof and at least one of a chalcogenide, wherein: the chalcogenide includes at least one of Se, Te, S, or combinations thereof.

10. The apparatus of claim 2 wherein the material of the middle layer includes at least one of $NbO_2$, $VO_2$, $V_2O_3$, $Fe_3O_4$, FeS, $Ta_2O_5$, $Ti_3O_5$, $Ti_2O_3$, $LaCoO_3$, $SmNiO_3$ or combinations thereof.

11. The apparatus of claim 2, wherein the first and second electrodes each include at least one of a first material, a second material, a third material, a fourth material, or combinations thereof: (a) the first material including at least one of copper, tungsten, tantalum, titanium, hafnium, zirconium, aluminum, silver, tin, lead, or combinations thereof; (b) the second material including an alloy of at least one of copper, tungsten, tantalum, titanium, hafnium, zirconium, aluminum, silver, tin, lead, or combinations thereof; (c) the third material including at least one of titanium nitride, tantalum nitride, or combinations thereof; and (d) the fourth material including at least one of hafnium carbide, zirconium carbide, titanium carbide, tantalum carbide, aluminum carbide, or combinations thereof.

12. The apparatus of claim 2, wherein each of the first and second insulation layers is less than 3 nm thick and the middle layer is at least 5 nm thick.

13. A system comprising:
a memory; and
a processor coupled to the memory,
wherein at least one of the processor or the memory includes an apparatus according to claim 1.

* * * * *